United States Patent [19]

Cory

[11] Patent Number: 5,394,088
[45] Date of Patent: Feb. 28, 1995

[54] NMR PROBE FOR IMAGING SMALL SAMPLES

[75] Inventor: David G. Cory, Boston, Mass.

[73] Assignee: Bruker Instruments, Inc., Billerica, Mass.

[21] Appl. No.: 194,112

[22] Filed: Feb. 8, 1994

Related U.S. Application Data

[63] Continuation of Ser. No. 760,599, Sep. 16, 1991, abandoned.

[51] Int. Cl.⁶ .............................................. G01V 3/00
[52] U.S. Cl. ..................................... 324/322; 324/321
[58] Field of Search ............... 324/307, 314, 318, 321, 324/322

[56] References Cited

U.S. PATENT DOCUMENTS

| | | | |
|---|---|---|---|
| 4,710,719 | 12/1987 | Doty | 324/318 |
| 4,859,950 | 8/1989 | Keren | 324/318 |
| 5,045,793 | 9/1991 | Rathke | 324/318 |
| 5,153,516 | 10/1992 | Gopalsami et al. | 324/309 |

FOREIGN PATENT DOCUMENTS

0453834A1 10/1991 European Pat. Off. .
WO91/17453 11/1991 WIPO .

OTHER PUBLICATIONS

Magnetic Resonance in Medicine, vol. 6, No. 1, Jan. 1988, Duluth, Minn., USA, R. C. Lyon et al., "A Versatile Multinuclear Probe Designed for in vivo NMR Spectroscopy: Applications to Subcutaneous Human Tumors in Mice". (pp. 1–14).

Journal of Magnetic Resonance, vol. 60, 1984, Orlando, Minn., USA, (pp. 397–404), P. Styles et al., "A High-Resolution NMR Probe in Which the Coil and Preamplifier are Cooled with Liquid Helium".

Magnetic Resonance in Medicine, vol. 11, No. 2, Aug. 1989, Duluth, Minn., USA, (pp. 209–220), P. Narayan et al., "Transrectal Probe for $^1$H MRI and $^{31}$P MR Spectroscopy of the Prostate Gland".

*Primary Examiner*—Louis Arana
*Attorney, Agent, or Firm*—Cesari and McKenna

[57] ABSTRACT

A small sample imaging apparatus replaces the dewar which normally passes along the axis of an NMR imaging probe. The small sample imaging apparatus incorporates an integral RF coil and capacitor resonant circuit. The coil and capacitor are positioned adjacent to each other and remotely at the end of a projecting stalk. Stray inductance effects are thereby avoided and the stalk physically positions the resonant circuit at substantially the properly centered location. The stalk which positions the coil and capacitor may be formed from a length of rigid coaxial cable which carried RF energy to the resonant circuit. When large samples are imaged, the conventional probe coil insert can be utilized in the normal manner. However, when smaller samples are images, the adapter can be attached to the probe and the adaptor resonant circuit can be utilized.

19 Claims, 6 Drawing Sheets

NMR PROBE FOR IMAGING SMALL SAMPLES

This application is a continuation of Ser. No. 07/760,599, filed Sep. 16, 1991, now abandoned.

FIELD OF THE INVENTION

This invention relates to imaging of solids and liquids produced by nuclear magnetic resonance (NMR) imaging of NMR-active nuclei and, in particular, to an improved $\mu$-imaging probe for imaging small solid and liquid samples.

BACKGROUND OF THE INVENTION

Nuclear magnetic resonance is a phenomenon exhibited by a select group of atomic nuclei and is based upon the existence of nuclear magnetic moments in these nuclei (termed "NMR active" nuclei). When an NMR active nucleus is placed in a strong, uniform and steady magnetic field, the spin magnetization of the nucleus precesses at a natural resonance frequency known as the Larmor frequency, which is characteristic of each nuclear type and is proportional to the applied field strength at the location of the nucleus. Typical NMR active nuclei include $^1H$ (protons), $^{13}C$, $^{19}F$ and $^{31}P$. The resonant frequencies of the nuclei can be observed by monitoring with an RF receiver the transverse magnetization which results after a strong RF pulse is applied at, or near, the Larmor frequency.

In order to use the NMR phenomenon to obtain an image of a sample, a magnetic field is applied to the sample, along with a magnetic field gradient which depends on physical position so that the field strength at different sample locations differs. When a field gradient is introduced, as previously mentioned, since the Larmor frequency for a particular nuclear type is proportional to the applied field strength, the Larmor frequencies of the same nuclear type will vary across the sample and the frequency variance will depend on physical position. By suitably shaping the applied magnetic field and processing the resulting NMR signals for a single nuclear type, a nuclear spin density image of the sample can be measured. Because the measured NMR signal is a function of the total number of nuclei of a given type, it is common to use a nucleus which is found in abundance in the sample to be imaged. For example, $^1H$ (protons) are commonly used because they are abundant in many materials and therefore, generate a large NMR signal.

FIG. 1A illustrates a portion of a prior art NMR imaging apparatus. As discussed above, the sample must be placed in a uniform magnetic field, a field gradient must be applied and RF pulses must also be applied in order to obtain the image. Accordingly, in conventional NMR spectrometers, the sample is usually mounted in a "probe" device for performing the actual imaging experiment. In FIG. 1A, probe 1 is utilized to hold and lower the sample into a magnet chamber (not shown) which provides the constant magnetic field. The probe comprises a hollow body 2. Passing through body 2 is a hollow copper tube 4. Several insulating platform plates 6, 8 and 10 are transversely mounted on the end of copper tube 4 which support and physically space the probe components. The sample is actually positioned within an RF coil 3 that serves a number of functions as described below. The RF coil is, in turn, surrounded by a gradient coil set 12 mounted on a hollow insulting form 14 which slides over coil 3 and electrically connects to the NMR probe by means of plug 16 and socket 20. In conventional systems, the coil set 12 may, for example, contain a Golay coil which generates a magnetic field gradient in a known manner. The coil set is positioned over coil 3 by means of platform plates 6, 8 and 10 which closely fit to the inner diameter 22 of coil form 14. A dewar 19 generally extends through tube 4 to allow cool or hot air to be blown over coil 3 to provide the system with the capability of varying the temperature of the coil during operation.

In order to properly accomplish NMR imaging, the probe device utilized should satisfy several design parameters. First, it is important to use an RF coil with a size that approximates that of the sample being imaged in order to make the system efficient and to improve the signal-to-noise ratio. More particularly, RF coil 3 serves two purposes. First, it transmits the strong RF pulse to the sample that is required to nutate the spin magnetization into a plane transverse to the static magnetic field direction and, second, it is used to receive the NMR signals generated by the nuclei. With regard to RF pulse transmission, it is well-known that physically larger coils require more energy than smaller coils to generate an RF field of a given strength at points within the coil. Since a coil sized slightly larger than the sample will deliver sufficient RF energy at all points within the sample to perform the experiment, a coil that is much larger than the sample will generate a significant field outside of the sample, thereby wasting much of the energy utilized to generate the RF pulse. Consequently, such a system is inefficient.

With regard to signal reception, only portions of the RF coil that are close to the sample are capable of gathering the weak NMR signals. Those portions of the coil remote from the sample receive only noise. Therefore, the RF coil should be approximately equal in size to the sample being imaged to ensure that it will gather all the NMR signals emitted from the sample without unduly increasing the amount of noise received.

Consequently, in order to facilitate the imaging of various size samples, the prior art system is capable of accommodating various RF inserts 15, each having a differently-sized RF coil so that the prior art probe can easily accommodate different-sized samples. Such an insert is shown in FIG. 1B. Each RF insert 15' includes a disk insulator 18' which incorporates a pair of connectors 13' which slide over the extension posts 11 in order to physically and electrically connect insert 15' to probe 1. Each RF insert 15' also includes a pair of leads 17' that extend from connectors 13' to electrically connect to RF coil 3'.

In the probe, RF coil 3 is connected to adjustable capacitors 5 to form a resonant circuit. Each adjustable capacitor 5 is connected to a tuning handle 7 via a tuning rod 9 so that the capacitors can be manually adjusted, thereby enabling the RF resonance circuit to be tuned.

For reasons known to those skilled in the art, it is important to center the RF coil in the middle of the constant magnetic field and the gradient field. Consequently, when in position, the RF insert is slid over extension posts 11 until the coil is centered. In order to accommodate coils of relatively large diameters, the RF inserts 15' are designed so that the coil centers are positioned several inches away from the insulator disk 18'. When large diameter RF coils are used, the length of leads 17 which connect the coil to the system is relatively short and does not significantly interfere with system performance. However, when smaller RF coils are utilized, in order to physically center coil 3 properly, relatively long leads 17 must be used to connect coil 3 to the connectors 13. At the resonance frequencies used in a typical NMR system, the stray inductance introduced by the leads 17 into the resonant circuit becomes significant in relation to the inductance of the smaller RF coil 3. This stray inductance does not contribute to either RF field generation or NMR signal gathering because it is positioned at a significant distance away from the sample. Therefore, the large stray inductance significantly reduces the efficiency of the probe circuit.

Accordingly, it is an object of the present invention to provide an efficient NMR probe for small samples.

It is another object of the present invention to provide an NMR probe which can accommodate samples of various sizes with efficient imaging capability.

It is still another object of the present invention to provide apparatus which can be used with existing imaging probes to more efficiently image small samples.

It is yet another object of the present invention to provide small sample imaging apparatus which can be used with existing μ-imaging probes.

It is a further object of the present invention to provide apparatus which can be used with existing μ-imaging probes to more efficiently image small samples without permanently modifying the existing probe.

It is still a further object of the present invention to provide small sample imaging apparatus which replaces the prior art RF coil insert with apparatus that efficiently utilizes a small diameter coil.

It is yet a further object of the present invention to provide small sample imaging apparatus which replaces the prior art RF coil insert and reduces stray capacitance to improve efficiency.

SUMMARY OF THE INVENTION

The foregoing problems are solved and the foregoing objects are achieved in one illustrative embodiment of the invention in which small sample imaging apparatus replaces the dewar which normally passes along the axis of an imaging probe. The small sample imaging apparatus incorporates an integral RF coil and capacitor resonant circuit. The coil and capacitor are positioned adjacent to each other and remotely at the end of a projecting stalk. Stray inductance effects are thereby avoided and the stalk physically positions the resonant circuit at substantially the properly centered location. The entire apparatus can be adjusted longitudinally within the dewar channel to properly position the coil at the center of the magnetic field.

More particularly, the stalk which positions the coil and capacitor is formed from a length of rigid coaxial cable which carries the RF energy to the resonant circuit. When large samples are imaged, the conventional probe coil insert can be utilized in the normal manner. However, when smaller samples are imaged, the adapter can be attached to the probe and the adapter resonant circuit can be utilized.

DETAILED DESCRIPTION OF THE PREFERRED EMBODIMENT

Figure 1:
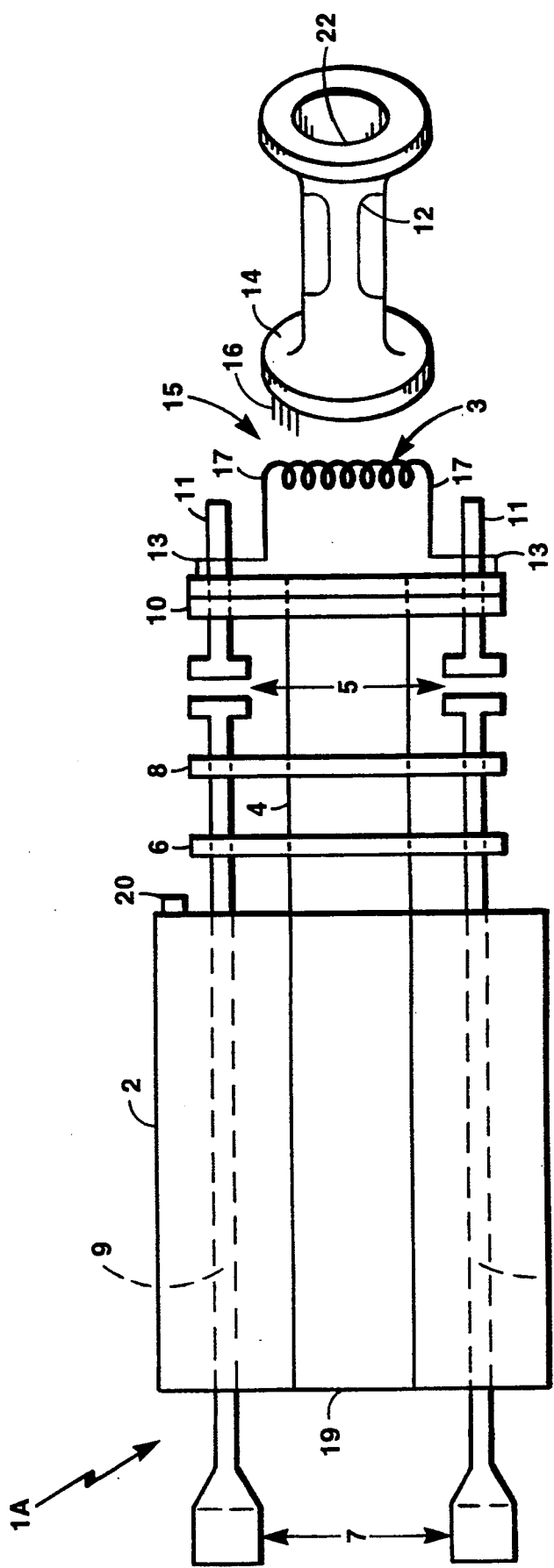
FIG. 1A is a side view of a prior art imaging probe.
FIG. 1B is a perspective view of a prior art coil insert.
Figure 1B:
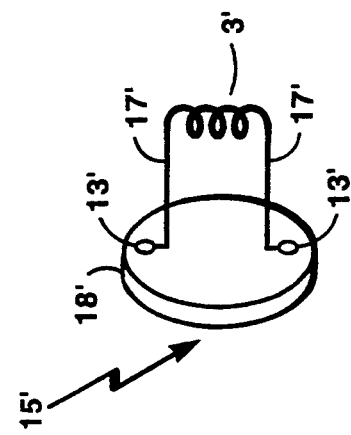
Figure 2:
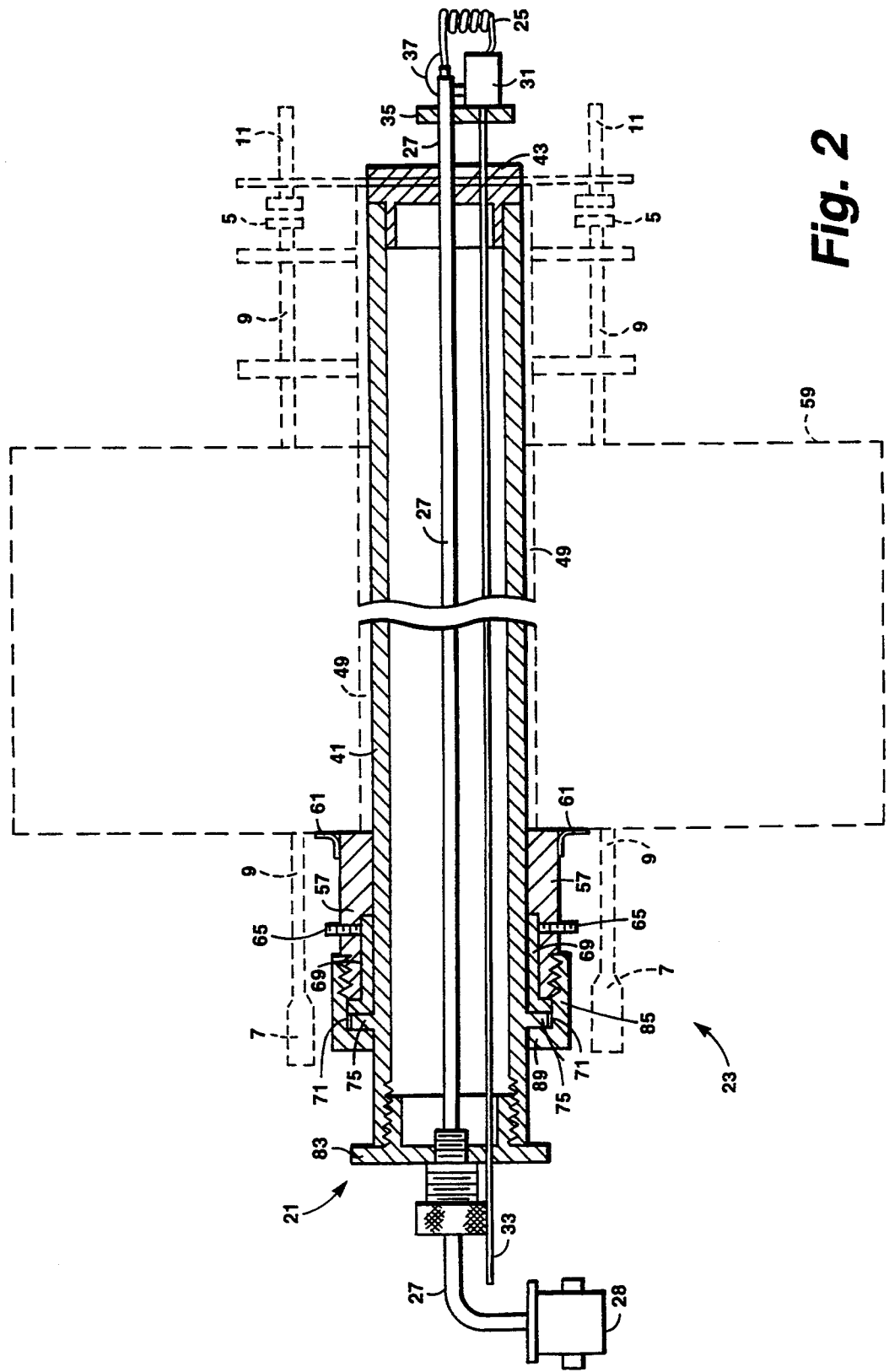
FIG. 2 is a side view of the small sample imaging apparatus of the present invention inserted into an existing imaging probe body.

FIG. 2 illustrates the small sample imaging apparatus 21 of the present invention into the prior art probe body that was shown in FIG. 1. The small sample imaging apparatus is inserted in the direction of arrow 23 through the copper tube 4 which normally houses the dewar 19 of the prior art probe. When the small sample imaging apparatus is used, the dewar is removed and is not used.

One key feature of the small sample imaging apparatus is that it utilizes its own capacitor 31 and RF coil 25 which can be matched to the size of a given small sample. Consequently, when the small sample imaging apparatus is utilized, capacitors 5 and RF coil insert 15 of the prior art probe are not utilized to form the resonant circuit. Because the small sample imaging apparatus does not utilize an RF coil insert 15, the resonant circuit does not include the long leads 17 that are associated therewith. Consequently, the small sample imaging apparatus does not suffer from the problem experienced by the prior art resulting from large stray inductance introduced into the circuit as a result of long leads.

Figure 3:
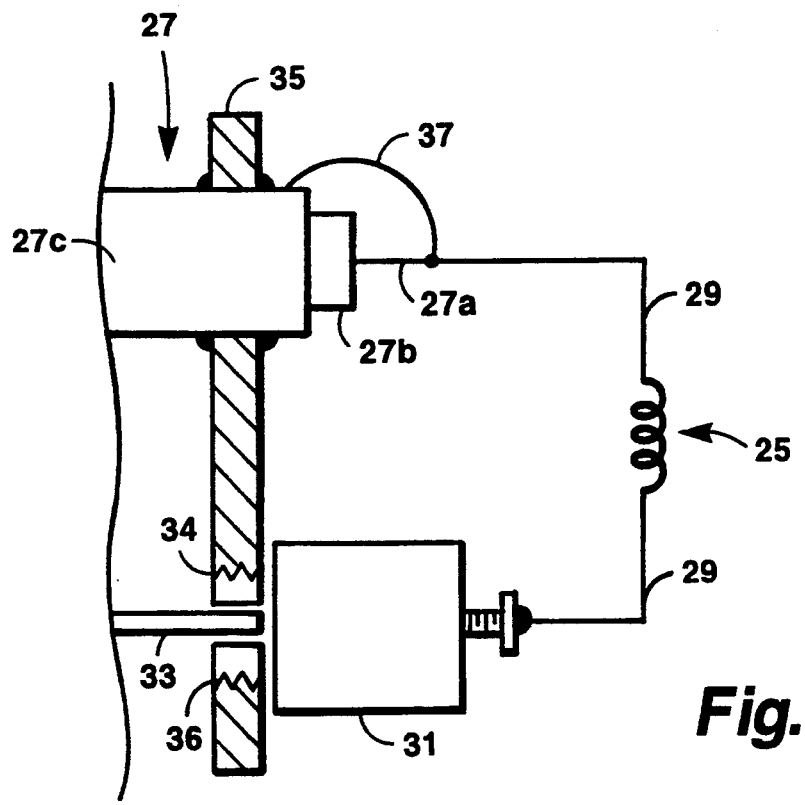
FIG. 3 is an enhanced view of the remote resonant circuit which is also shown in FIG. 2.
Figure 4A:
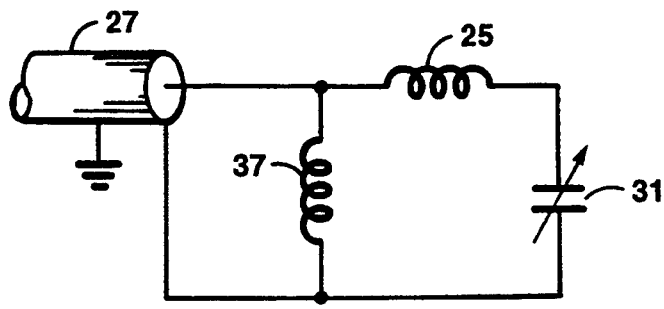
FIG. 4A is an electrical schematic representation of the preferred embodiment of the resonant circuit.
Figure 4B:
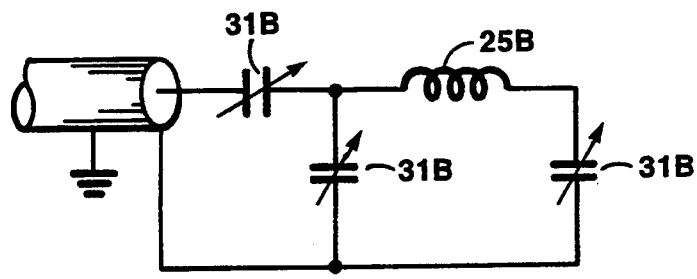
FIG. 4B is an electrical schematic representation of an alternate embodiment of the resonant circuit.
Figure 4C:
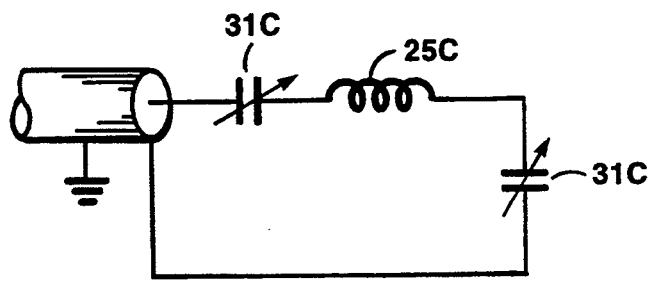
FIG. 4C is an electrical schematic representation of an alternate embodiment of the resonant circuit.

The remote resonant circuit of the small sample imaging apparatus is formed on a stalk which supports the entire circuit at substantially the correct physical position. The supporting stalk is formed from coaxial cable 27 which also passes through the apparatus and is utilized to connect the circuit, through a conventional BNC bayonet connector 28, to a source capable of providing an appropriate RF pulse. The conventional coaxial cable is comprised of three components that are most clearly shown in FIG. 3. The signal carrying wire 27a is enclosed within an insulating layer 27b which is in turn enclosed within a solid metal shield 27c. In the preferred embodiment of the invention, the signal carrying wire 27a is connected, via a lead 29, to the RF sample coil 25. The small RF coil is further connected, via a second lead 29, to a variable capacitor 31. The variable capacitor 31 can be adjusted through the use of the tuning wand 33. A metal supporting bracket 35 has a hole through which cable 27 passes. Bracket 35 is soldered to the outer shield 27c of cable 27 to form a rigid connection. Bracket 35 is also provided with a threaded opening 34 into which a threaded nipple on capacitor 31 is screwed. Bracket 35 thereby establishes an electrical connection between one side of variable capacitor 31 and the metal shield 27c of coaxial cable 27. A short wire, 37, acts as a shunt inductance between the cable conductor 27a and the cable shield 27c to complete the resonant circuit. An electrical schematic circuit diagram of the equivalent resonance circuit for the preferred embodiment is shown in FIG. 4A. Other resonant circuits could also be utilized to practice the present invention. FIGS. 4B and 4C each demonstrate an electrical schematic circuit diagram for resonant circuits that could be utilized in alternate embodiments of the invention. In the circuit shown in FIG. 4B, the RF coil 25B is connected with three variable capacitors 31B as shown. In the circuit shown in FIG. 4C, the RF coil 25C is connected in series with two variable capacitors 31C.

Figure 5:
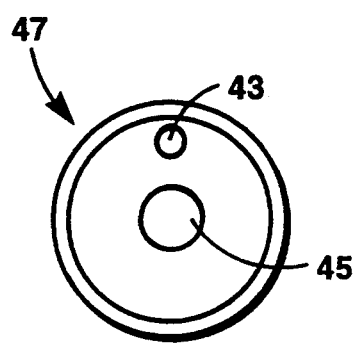
FIG. 5 is a bottom view of the top cover.
Figure 6:
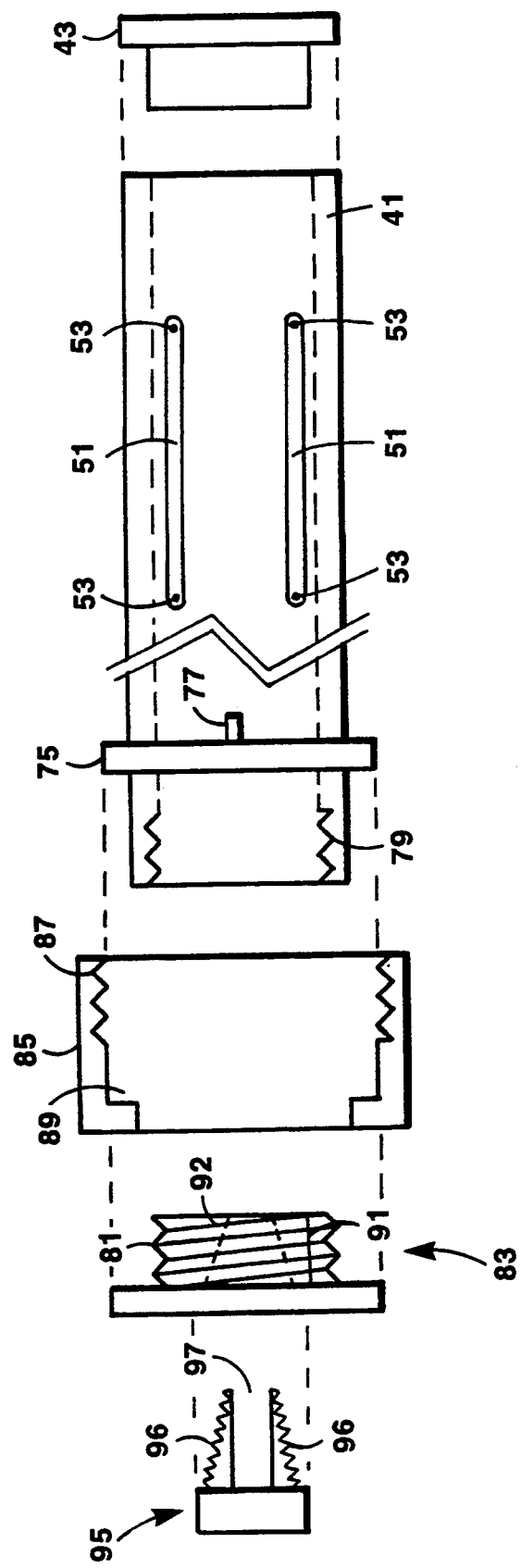
FIG. 6 is a enhanced side view of the connection components of the inventive small sample imaging apparatus.

The remainder of the small sample imaging apparatus is comprised of a tubular body 41 that extends through the length of the existing probe. In the preferred embodiment of the invention, body 41 is made from aluminum and the outer surface is copper-plated and electroflashed with a rare earth metal such as, for example, rhodium. This is a typical manufacturing process which is used because the finish allows solder to adhere to the body 41, but does not tarnish. The tubular body 41 is open at each end. On the body end closest to the RF coil 25, 41 is closed by a top cover 43 which is illustratively formed from the same material as the body 41 and press-fitted into the end of body 41. Cover 43 is provided with holes 45 and 47 for respectively allowing the passage of the tuning wand 33 and coaxial cable 27; the holes 45 and 47 are best shown in FIG. 5. At this top end of the apparatus, there is no interconnection between the small sample imaging apparatus and the existing probe structure. Therefore, body 41 can be adjustably slid relative to the existing probe in order to perform small alignment adjustments. The opposite end of body 41 (as shown in FIG. 6) is provided with an annular flange 75 that extends around its circumference. The annular flange 75 is, in turn, provided with a key 77 extending out therefrom. This end of body 41 is also internally tapped at 79. An internally threaded collar 85 fits over the end of body 41 and a shoulder 89 of the collar 85 bears against flange 75. Body 41 is completed by a threaded cap 83 having an externally threaded nipple 81 which screws into threads 79 of body 41. Cap 83 holds collar 85 captive, but rotatable.

Body 41 is also not connected to the interior surface of the existing probe tube 4.. However, a sliding contact is made between body 41 and tube 4 as body 41 is friction fitted within the aluminum tube. Additionally, a frictional and electrical connection is formed between the body 41 and the aluminum tube 4 by means of a set of retractable springs.

Figure 7:
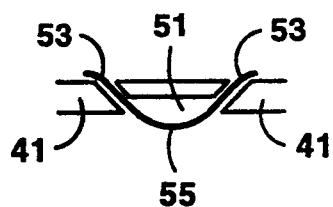
FIG. 7 illustrates a side view of a spring located on the insert body which makes electrical and physical contact with the inside of the prior art probe body.

More particularly, body 41 is provided with a series of longitudinal grooves 51 that are best shown in FIG. 6. In the preferred embodiment of the invention, three grooves are utilized and each is spaced equally around the circumference of body 41. Each groove 51 is provided with a pair of slanted holes 53, with one hole being positioned at each end of the groove; the slanted holes are illustrated in FIGS. 6 and 7. A spring 55 is provided within each groove and is retained by its elongate ends which extend through the holes 53 at opposite ends of the groove. In the preferred embodiment of the invention, the springs are formed from non-magnetic spring material such as, for example, phosphor-bronze wire. Each spring 55 extends slightly out of its corresponding groove beyond the outer surface of the body 41 and contacts the inner surface of tube 4 when body 41 is in position.

Figure 8:
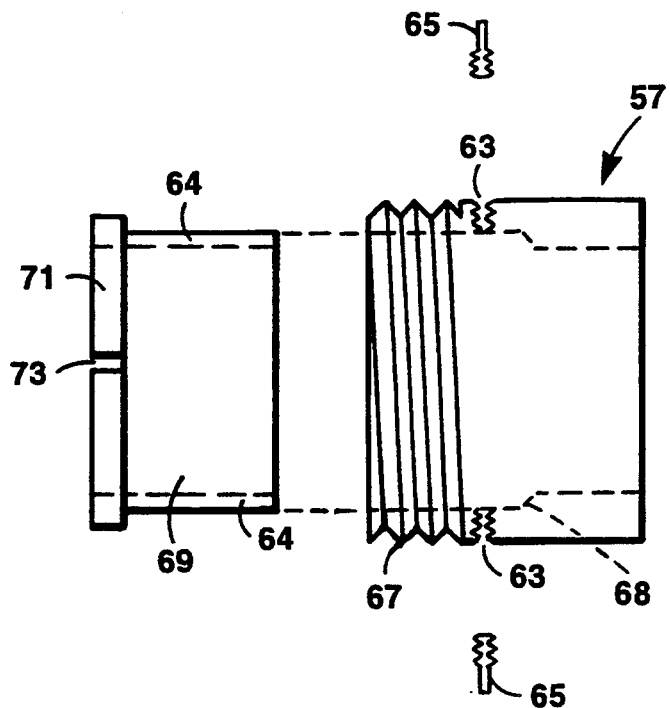
FIG. 8 is an enhanced side view of the components utilized to support the small sample imaging apparatus within an existing probe body.

A rigid, but adjustable connection is provided between the opposite end of the small sample imaging apparatus and the end of the existing probe body and is shown in FIGS. 2, 6 and 8. FIG. 8 illustrates the additional components utilized to support the apparatus within the existing probe. A hollow cylindrical insert support 57 is attached to the body of the existing probe 59 via right-angle brackets 61 as shown in FIG. 2. Insert support 57 slides over apparatus body 41 and is provided with opposing tapped holes 63 which accept set screws 65. The insert support further has a male threaded end 67 and a counterbored section 68 which accommodate a sliding stop as discussed below. In the preferred embodiment of the invention, the insert support is formed from the same copper-plated and electroflashed aluminum that is utilized to form the body 41.

A hollow cylindrical sliding stop 69 slides into counterbore 68 and illustratively is also formed from the same material as the body 41. Stop 69 is utilized to longitudinally adjust the position of the small sample apparatus relative to the existing probe body as is more fully described below. Additionally, stop 69 is also utilized to adjust the rotational position of the small sample apparatus relative to the existing probe body so that the RF coil can be aligned with an appropriate gradient produced by the magnet chamber in order to accomplish NMR imaging. Normally, rotational and longitudinal alignment is performed with the the probe in place while a simple one-dimensional imaging experiment is being conducted.

Once the proper rotational position of the small sample apparatus is determined, set screws 65 slide in opposing tapped holes 63 and are tightened until they contact the stop 69, thereby preventing rotation of the stop 69 relative to the support 57. Stop 69 is provided with a stop face 71 in which a keyway 73 is located. Keyway 73 accommodates key 77 (FIG. 6) located at the end of the apparatus body 41. Therefore, once the key 77 of the apparatus body 41 is inserted into the keyway 73, the rotational position of the small sample apparatus is fixed relative to the existing probe body.

Stop 69 can also be slid longitudinally to position the RF coil at the proper location in the magnetic field as described above. After this positioning has been determined, the stop 69 is locked into position relative to the support 57, and consequently the existing probe body, by tightening the set screws 65. Thereafter, collar 85 is turned to engage the threaded end 67 of support 57. Flange 75 is thereby drawn up against stop face 71 as shown in FIG. 2 to rigidly lock the body 41 into the probe body 4.

Figure 9:
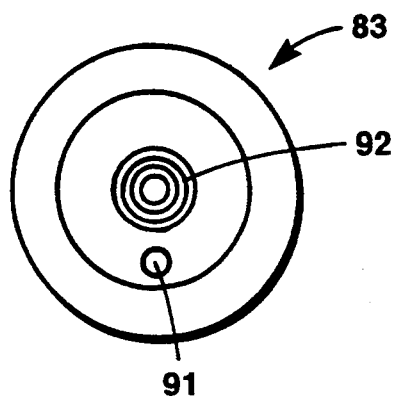
FIG. 9 is a top view of the bottom cover.

As shown in FIGS. 6 and 9, cover 83 is provided with a hole 91 that enables the tuning wand 33 to pass therethrough and is also provided with a tapped hole 92. Hole 92 accommodates a split sleeve 95 for securing the coaxial cable 27 to body 41. In particular, coaxial cable 27 is passed through a hole 97 in the sleeve 95 as well as the passageway 93. The threaded nipple 96 of sleeve 95 is slightly tapered and slotted so that when sleeve 95 is screwed into tapped hole 92, nipple 96 tightens around the outer sheath of cable 27 locking it in place.

Although the small sample imaging apparatus of the present invention enables improved system performance for imaging small samples, it does not require the use of a separate and discrete imaging probe. Consequently, when large samples are imaged, the small sample imaging apparatus of the present invention need not be utilized. Rather, the imaging probe can simply be utilized, along with an RF insert 15, in the manner described with regard to the prior art probe illustrated in FIG. 1.

It should be understood the various changes and modifications of the embodiment shown in the drawings may be made within the scope of this invention. Thus, it is intended that all matter contained in the above description and shown in the accompanying drawings shall be interpreted in an illustrative, and not limiting, sense.

What is claimed is:

1. An NMR imaging apparatus comprising:
   a conventional NMR probe having a cylindrical probe body with an outer end and an inner end and a means for generating NMR images connected to the probe body inner end, the probe body having a hollow dewar channel extending longitudinally therethrough;
   the means for generating NMR images including a first variable capacitor for forming a first resonant circuit with a sample imaging coil;
   a small-sample imaging apparatus having an elongate, cylindrical insert body having a first end and a second end;
   the insert body further having a diameter which allows the insert body to slide through the dewar channel so that the first end extends to the probe body inner end;
   means for attaching the insert body's second end to the probe body outer end when the insert body is positioned within the probe body;
   a small-sample imaging coil;
   means for mounting the small-sample imaging coil at a predetermined distance from the first end;
   a second variable capacitor physically mounted substantially adjacent to the small-sample imaging coil and electrically connected to the coil to form a resonant circuit so that substantially all inductance in the resonant circuit arises from the small-sample imaging coil and substantially all the capacitance in the resonant circuit arises from the second variable capacitor; and
   means for applying radio frequency energy to the second resonant circuit.

2. Small-sample imaging apparatus as claimed in claim 1 wherein said coil mounting means comprises a rigid stalk connected to said first end and to said coil.

3. Small sample imaging apparatus as claimed in claim 2 wherein said stalk comprises a section of rigid coaxial cable connected to said first end and to said coil for supporting said resonant circuit and for delivering radio-frequency energy to said resonant circuit.

4. Small-sample imaging apparatus as claimed in claim 1 wherein said applying means comprises a coaxial cable for delivering said radio-frequency energy to said resonant circuit.

5. Small sample imaging apparatus as claimed in claim 4 wherein said coaxial cable comprises an outer metal shield, an insulating layer and a signal-carrying wire for delivering said radio-frequency energy, and wherein said signal-carrying wire is physically and electrically connected to said coil, said capacitor is physically and electrically connected to said coil, and said capacitor is physically and electrically connected to said outer shield.

6. Small sample imaging apparatus as claimed in claim 5 further comprising a shunt inductor connected between said signal-carrying wire and said outer shield.

7. Small sample imaging apparatus as claimed in claim 5 further comprising a metal bracket connected to said outer metal shield and connected to said capacitor for physically and electrically connecting said capacitor to said outer shield.

8. Small-sample imaging apparatus as claimed in claim 1 wherein said insert body is mechanically and slidably connected to said probe body outer end.

9. Small-sample imaging apparatus as claimed in claim 1 wherein said capacitor is adjustable and said apparatus further comprises means for manually adjusting said capacitor.

10. Small sample imaging apparatus as claimed in claim 9 wherein said capacitor adjusting means passes through said insert body.

11. An NMR imaging apparatus comprising:
    a conventional NMR imaging probe having a cylindrical probe body with an inner end and outer end and a cylindrical dewar channel positioned coaxially within the probe body and extending longitudinally therethrough;
    a first resonant circuit for delivering radio frequency energy to a sample and for gathering NMR signals generated thereby;
    the first resonant circuit including a removable coil, a first adjustable capacitor, and means for mounting the first resonant circuit on the probe inner end;
    a small-sample imaging apparatus interchangeable with the removable coil and comprising an elongate, cylindrical insert body having a first end, a second end and a diameter which allows the insert body to slide the through the dewar channel so that the first end extends to the probe body inner end;
    means for attaching the insert body second end into the probe body outer end;
    a small-sample imaging coil;
    a rigid stalk connected to the first end and to the small-sample imaging coil for mounting the small-sample imaging coil at a predetermined distance from the first end;
    a second adjustable capacitor physically mounted on the stalk at the predetermined distance from the first end and substantially adjacent to the small-sample imaging coil and electrically connected to the small-sample imaging coil to form a second resonant circuit so that substantially all inductance in the second resonant circuit arises from the sample imaging coil and substantially all the capacitance in the second resonant circuit arises from the second adjustable capacitor;
    a coaxial cable passing through the insert body and connected to the second resonant circuit for applying radio frequency energy to the second resonant circuit; and
    means passing through the insert body for manually adjusting the second adjustable capacitor.

12. Small-sample imaging apparatus as claimed in claim 11 wherein said second adjustable capacitor is electrically connected to said small-sample imaging coil by a wire and said capacitor is physically located close to said small-sample imaging coil so that the inductance of said wire at said radio-frequency is small relative to the inductance of said coil at said radio-frequency.

13. Small sample imaging apparatus as claimed in claim 12 wherein said coaxial cable has a rigid metal outer shield and said stalk comprises a section of rigid coaxial cable connected to said first end and to said small-sample imaging coil for supporting said second resonant circuit and for delivering radio-frequency energy to said second resonant circuit.

14. Small-sample imaging apparatus as claimed in claim 11 wherein said coaxial cable comprises an outer metal shield, an insulating layer and a signal-carrying wire for delivering said radio-frequency energy, and wherein said signal-carrying wire is physically and electrically connected to said coil, said capacitor is physically and electrically connected to said small-sample imaging coil, and said second adjustable capacitor is physically and electrically connected to said outer shield.

15. Small sample imaging apparatus as claimed in claim 14 further comprising a shunt inductor connected between said signal-carrying wire and said outer shield.

16. Small-sample imaging apparatus as claimed in claim 14 further comprising a metal bracket connected to said outer metal shield and connected to said capacitor for physically and electrically connecting said capacitor to said outer shield.

17. Small-sample imaging apparatus as claimed in claim 11 further comprising a hollow support mechanically connected to said probe body, a stop slidable within said support, means for adjustably fastening said stop to said support and means for rigidly connecting said insert body to said stop.

18. A small-sample NMR imaging probe in combination with an NMR imaging system, the NMR imaging system employing a removable coil insert for use when a sample is equal to, or greater than, a predetermined size, the coil insert comprising a radio-frequency coil and a connector for connecting the coil to a first adjustable capacitor, the combination comprising:
   an imaging probe having a cylindrical probe body with an outer end and an inner end, the probe body having a hollow dewar channel extending longitudinally therethrough;
   first adjustable capacitor mounted on the probe body inner end;
   an elongate, cylindrical insert body for use when the sample is less than the predetermined size, the insert body having a first end and a diameter which allows the insert body to slide through the dewar channel so that the first end extends to the probe body inner end;
   a small-sample imaging coil;
   means for mounting the small-sample imaging coil at a predetermined distance from the first end;
   a second adjustable capacitor mounted in close proximity to the small-sample imaging coil and electrically connected to the small-sample imaging coil to form a resonant circuit so that substantially all the inductance in the circuit arises from the small-sample imaging coil and substantially all the capacitance in the resonant circuit arises from the second variable capacitor; and
   means for applying radio frequency energy to the resonant circuit.

19. An NMR imaging apparatus comprising:
   an NMR probe having a probe body with an inner end and an outer end and means for generating NMR images connected to the probe body;
   the means for generating NMR images including a first imaging coil and first variable capacitor;
   the means for generating NMR images further being interchangeable with a small-sample imaging apparatus;
   a small-sample imaging apparatus comprising;
   a) an insert body having a first end, the insert body being insertable into the probe body;
   b) means for attaching the insert body to the probe body outer end after the insert body has been inserted into the probe body;
   c) a second imaging coil;
   d) means for mounting the second imaging coil at a predetermined distance from the first insert body and;
   e) a second variable capacitor physically mounted sufficiently close to the second imaging coil and electrically connected to the second imaging coil to form a resonant circuit so that substantially all inductance in the resonant circuit arises from the second imaging coil and all the capacitance arises from the second variable capacitor; and
   f) means for applying radio frequency energy to the resonant circuit.

* * * * *